US008039356B2

(12) United States Patent
Herrin et al.

(10) Patent No.: US 8,039,356 B2
(45) Date of Patent: Oct. 18, 2011

(54) THROUGH SILICON VIA LITHOGRAPHIC ALIGNMENT AND REGISTRATION

(75) Inventors: Russell T. Herrin, Essex Junction, VT (US); Peter J. Lindgren, Essex Junction, VT (US); Edmund J. Sprogis, Underhill, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 44 days.

(21) Appl. No.: 12/690,299

(22) Filed: Jan. 20, 2010

(65) Prior Publication Data
US 2011/0177670 A1    Jul. 21, 2011

(51) Int. Cl.
*H01L 21/76* (2006.01)
(52) U.S. Cl. .... 438/401; 438/462; 430/314; 257/E21.24
(58) Field of Classification Search .................. 438/401, 438/462, 947, 975; 430/30, 311, 314
See application file for complete search history.

(56) References Cited

U.S. PATENT DOCUMENTS

| 4,978,419 | A   | 12/1990 | Nanda et al. |
| 6,521,493 | B1  | 2/2003  | Alsmeier et al. |
| 6,610,448 | B2  | 8/2003  | Sato et al. |
| 6,809,005 | B2  | 10/2004 | Ranade et al. |
| 6,818,524 | B1* | 11/2004 | Yang et al. .................. 438/401 |
| 7,381,503 | B2  | 6/2008  | Smith et al. |
| 7,485,965 | B2  | 2/2009  | Lanzerotti et al. |
| 7,510,916 | B2  | 3/2009  | Chu |
| 7,723,181 | B2* | 5/2010  | Liu et al. ........................ 438/243 |
| 2006/0091476 | A1* | 5/2006 | Pinnow et al. ................ 257/379 |
| 2006/0234440 | A1* | 10/2006 | Wu et al. ........................ 438/243 |
| 2007/0018341 | A1* | 1/2007 | Hsieh et al. .................... 257/797 |
| 2007/0035031 | A1 | 2/2007 | Jessen et al. |
| 2007/0059871 | A1* | 3/2007 | Yamazaki ..................... 438/197 |
| 2007/0184355 | A1 | 8/2007 | Wallace et al. |
| 2007/0190736 | A1* | 8/2007 | Liu et al. ........................ 438/386 |
| 2007/0224519 | A1 | 9/2007 | Sivakumar et al. |
| 2008/0085599 | A1* | 4/2008 | Van Haren et al. ........... 438/637 |
| 2009/0160009 | A1* | 6/2009 | Dietz et al. .................... 257/506 |
| 2011/0111560 | A1* | 5/2011 | Purushothaman et al. ... 438/109 |

OTHER PUBLICATIONS

Yamazoe, et al., "Resolution Enhancement by Aerial Image Approximation with 2D-TCC," Proceedings of SPIE, vol. 6730, Photomask Technology 2007, Sep. 18-21, 2007, pp. 67302H-1-67302H-12.

* cited by examiner

*Primary Examiner* — Alexander Ghyka
(74) *Attorney, Agent, or Firm* — Gibb I.P. Law Firm, LLC; Richard M. Kotulak, Esq.

(57) ABSTRACT

A method of manufacturing an integrated circuit structure forms a first opening in a substrate and lines the first opening with a protective liner. The method deposits a material into the first opening and forms a protective material over the substrate. The protective material includes a process control mark and includes a second opening above, and aligned with, the first opening. The method removes the material from the first opening through the second opening in the protective material. The process control mark comprises a recess within the protective material that extends only partially through the protective material, such that portions of the substrate below the process control mark are not affected by the process of removing the material.

10 Claims, 10 Drawing Sheets

THROUGH SILICON VIA LITHOGRAPHIC ALIGNMENT AND REGISTRATION

CROSS-REFERENCE TO RELATED APPLICATIONS

This application is related to the following co-pending application filed concurrently herewith by the same Applicant and assigned to the same Assignee entitled "PHOTOMASKS HAVING SUB-LITHOGRAPHIC FEATURES TO PREVENT UNDESIRED WAFER PATTERNING", having application Ser. No. 12/690,312. The complete disclosure of this co-pending application is incorporated herein by reference.

BACKGROUND

1. Field of the Invention

The embodiments of the invention generally relate to processes for manufacturing integrated circuit devices and, more specifically, to various methods that eliminate openings within substrates that can be formed below mask process control marks.

2. Description of the Related Art

When manufacturing integrated circuit devices, it is common to utilize masks that include process control marks that ensure that the mask is in the proper position relative to the substrate. For example, through silicon vias (TSV's) are used for conductively contacting the backside of a ground wafer. Uses of TSV's include grounded emitter SiGe, insulated TSV silicon carriers, etc. For the insulated TSV approach, the TSV is patterned, etched, and filled with a placeholder polysilicon, which is later removed and refilled with a conductor, such as tungsten. This disclosure describes the lithographic marks used for aligning, measuring overlay, and measuring critical dimensions used with integrated circuit technologies, such as insulated and grounded TSV's and other structures.

With insulated TSV's, a TSV opening is patterned and etched prior to deep trench capacitor and/or shallow trench isolation formation. With grounded TSV's, a TSV opening is patterned and etched post transistor formation in the contact module. Problems with the formation of such structures include that extra structures are placed by the mask house somewhat randomly for their mask metrology (critical dimension (cd), cd variability, etc.). If these extra shapes intersect an N-well-P-well boundary, or if they are inside the wrong well, then the extra shapes may cause a high resistance short path which will degrade yield or reliability.

An etching mask is used to etch out the sacrificial polysilicon from the TSV. The placeholder material removal process is performed with a mixture of isotropic (wet) and anisotropic (dry) etching. If the etching mask shape falls over crystalline silicon, then large cavities will be etched into the silicon. Such cavities can destroy underlying structures. Such extra structures can also exacerbate wafer breakage issues due to alignment of the TSV with the crystal plane.

SUMMARY

Disclosed herein are various methods of manufacturing an integrated circuit structure. In one exemplary embodiment, one method forms a first opening in a substrate (such as silicon substrate) and then lines the first opening with a protective layer (such as an oxide liner). Then the method deposits a material (such as a polysilicon material) into the first opening. In some embodiments, the method can form one or more structures (such as a protective pad, capacitors, transistors, etc.) on the silicon substrate.

The methods also form the protective material (such as an organic photoresist mask) over the silicon substrate. The organic photoresist mask includes a process control mark and a second opening. The second opening is above, and aligned with, the first opening. The method performs a material removal process by, for example, performing reactive ion etching to remove the polysilicon material from the first opening through the second opening in the organic photoresist mask.

If a protective structure is utilized, the process control mark is above, and aligned with, the protective structure. With the embodiments herein, the process control marks can be formed above a kerf region of the silicon substrate or can be formed above other regions of the substrate.

Further, the process control mark can comprise a sub-lithographic recess (that is smaller than the minimum lithographic ground rule size) within the organic photoresist mask that extends only partially through the organic photoresist mask, such that portions of the silicon substrate below the process control mark are not affected by the reactive ion etching. In such embodiments, the process control mark does not extend completely through the organic photoresist mask but instead only extends partially through the mask. Thus, the organic photoresist mask protects portions of the silicon substrate that are not beneath the second opening.

Further, the process control mark can comprise a recess that is not sub-lithographic, but is significantly smaller than other structures to be etched with the photomask. This leads to shallower features, and less damage to the silicon substrate.

Further, alignment, overlay, and other lithographic marks are placed at a sufficient distance from features to be deeply etched, preventing damage to these lithographic marks if chemical-mechanical polishing processes cause dishing or other non-uniformities.

The reactive ion etching comprises a process that would damage the silicon substrate. The organic photoresist mask, the oxide liner, and the protective structure protect the silicon substrate from such reactive ion etching.

BRIEF DESCRIPTION OF THE DRAWINGS

The embodiments of the invention will be better understood from the following detailed description with reference to the drawings, which are not necessarily drawing to scale and in which.

DETAILED DESCRIPTION

The embodiments of the invention and the various features and advantageous details thereof are explained more fully with reference to the non-limiting examples that are illustrated in the accompanying drawings and detailed in the following description.

Chip process control marks are added during wafer processing to allow proper alignment when creating the different integrated circuit structures. It is necessary to have symmetry for wafer frontside/backside processing. An integrated circuit chip needs to either be centered in 0,0 on wafer, or the chip corner needs to be centered to allow for X-Y mirroring of the wafer front/backside step plan.

As mentioned above the various process control marks utilized can create extra shapes and if these extra shapes intersect an N-well-P-well boundary, or if they are inside the wrong well, then the extra shapes may cause a high resistance or short path which will degrade yield or reliability. These extra shapes can also exacerbate wafer breakage issues due to alignment of the TSV with the crystal plane of the substrate. Therefore, embodiments herein use shapes for mask alignment and mask inspection which can be sub-lithographic, and which do not extend fully through the mask, so that the shapes will not print on the substrate. The term "sub-lithographic" means that the opening in the mask is smaller than the minimum size feature allowed by the previously established lithographic ground rules for the structure being manufactured and will not allow access to the underlying substrate (even if the opening is formed completely through the mask). For example, if a set of lithographic parameters has a minimum ground rule of 3 um and a 4 um thick photoresist, a sub-lithographic feature would only be a fraction (0.5; 0.25; 0.1; etc.) of the minimum ground rule opening such as a 0.4 um width opening.

Figure 1:
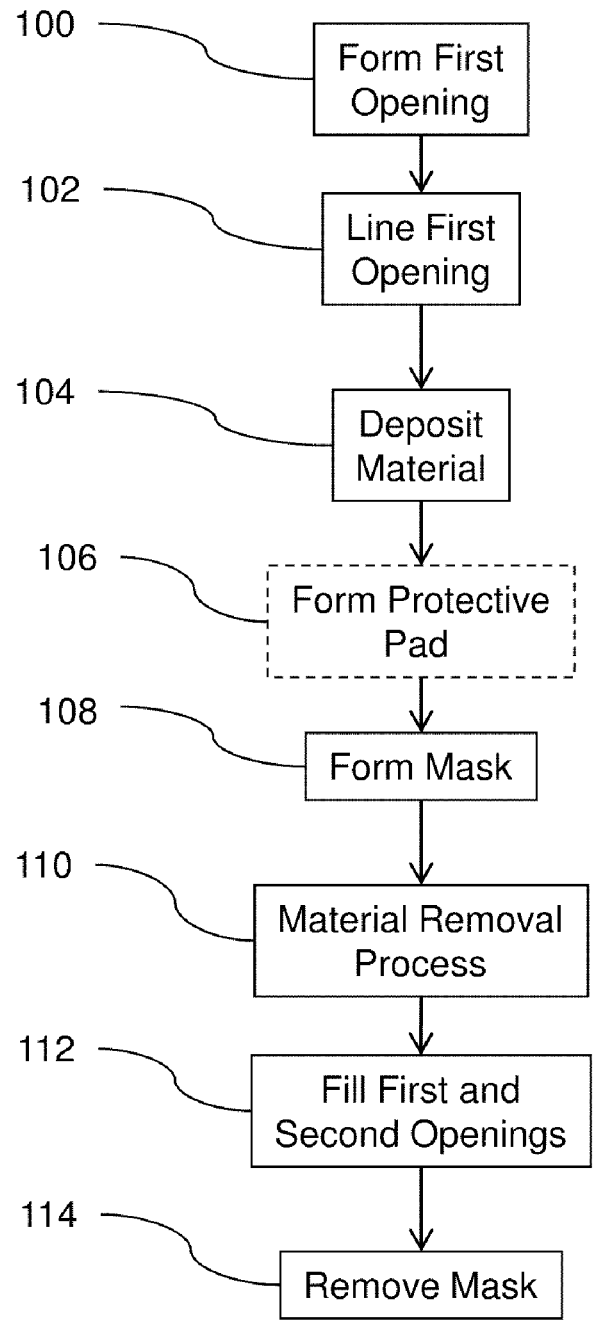
FIG. 1 is a flow chart illustrating method embodiments herein.

As shown in flowchart form in FIG. 1, in item 100 one exemplary method herein forms a first opening in a substrate (such as silicon substrate) and then, in item 102, lines the first opening with a protective layer (such as an oxide liner). Then, in item 104, the method deposits a material (such as a polysilicon material) into the first opening. In some embodiments, the method can form a one or more structures (such as a protective pad, capacitors, transistors, etc.) on the silicon substrate (as shown in item 106).

The methods also form the protective material (such as an organic photoresist mask) over the silicon substrate in item 108. The organic photoresist mask includes a sub-lithographic process control mark and a second opening. The second opening is above, and aligned with, the first opening. In item 110, the method performs a material removal process by, for example, performing reactive ion etching to remove the polysilicon material from the first opening through the second opening in the organic photoresist mask.

A shown in item 112, the method can fill the first and second openings with an appropriate conductive material and then remove the mask (item 114) to form a conductive structure extending above the first opening.

If a protective structure is utilized, the process control mark is above, and aligned with, the protective structure. With the embodiments herein, the process control marks can be formed above a kerf region of the silicon substrate or can be formed above other regions of the substrate.

Further, the process control mark can comprise a recess within the organic photoresist mask that extends only partially through the organic photoresist mask, such that portions of the silicon substrate below the process control mark are not affected by the reactive ion etching. In such embodiments, the process control mark can be sub-lithographic and does not extend completely through the organic photoresist mask but instead only extends partially through the mask. Thus, the organic photoresist mask protects portions of the silicon substrate that are not beneath the second opening.

The reactive ion etching comprises a process that would damage the silicon substrate. The organic photoresist mask, the oxide liner, and the protective structure protect the silicon substrate from such reactive ion etching.

Figure 2:
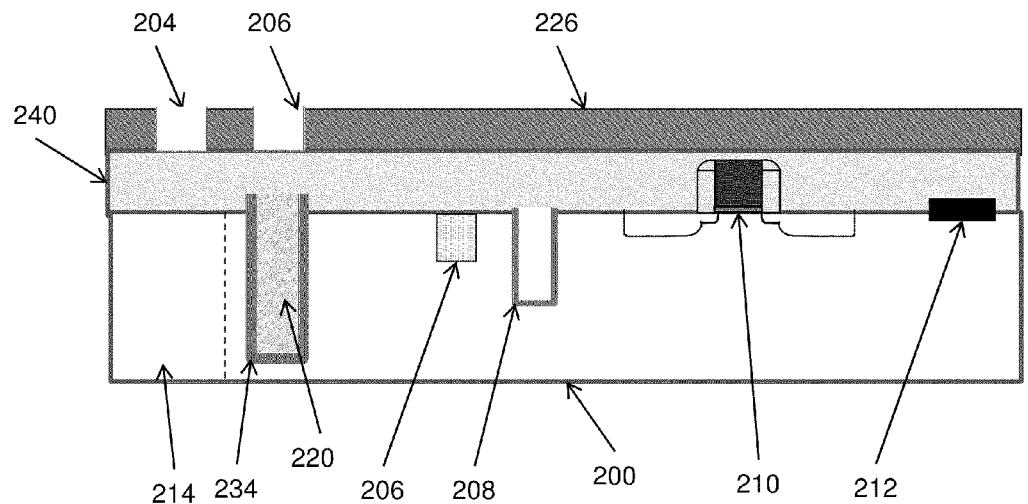
FIG. 2 is a schematic cross-sectional diagram of an integrated circuit structure according to embodiments herein.

FIG. 2 illustrates a cross-sectional view of a partially completed integrated circuit structure that is formed within the substrate 200 (such as a silicon substrate). The structure includes a kerf region 214 that will be removed when the substrate 200 is diced into chips. In addition, an opening 234 has been formed within the substrate 200. The process of forming openings within substrates is well known to those ordinarily skilled in the art (e.g., see U.S. Pat. Nos. 4,978,419 and 7,485,965, the complete disclosures of which are incorporated herein by reference) and a detailed discussion of such processes is not included herein. All the openings mentioned in this disclosure can be formed by any conventionally known method (or methods developed in the future) such as etching substrate material through a patterned mask.

The opening 234 has been lined with a liner (oxide, a nitride, etc.) and filled with a placeholder material 220 such as polysilicon. Again, the processes of lining openings and filling openings with material are well-known to those ordinarily skilled in the art (e.g., see U.S. Pat. No. 6,521,493, the complete disclosure of which is incorporated herein by reference) and a detailed discussion of such processes is not included herein. The lining material can be formed, for example, by growing an oxide or nitride on the sidewalls of the opening. In addition, material can be grown or placed within the opening using any conventionally known process such as spin-on processing, sputtering, vapor depositions, etc. The opening 234 will eventually become the through silicon via (TSV).

Item 206 represents a shallow trench isolation region within the substrate 200. The processes for forming said structures are well-known to those ordinarily skilled in the art (e.g., see U.S. Pat. No. 7,394,131, the complete disclosure of which is incorporated herein by reference in a detailed discussion of the same is not include herein). Shallow trench isolation regions can be formed by removing a portion of the substrate and replacing it with an insulator material such as an oxide.

Item 208 represents a deep trench capacitor. Again, the processes for forming such structures are well-known to those ordinarily skilled in the art (e.g., see U.S. Pat. No. 6,809,005, the complete disclosure of which is incorporated herein by reference) and a detailed discussion of the processes for forming deep trench capacitors is not included herein. Generally, deep trench capacitors can be formed by patterning a trench within the substrate, lining the trench with an insulator (oxide, nitride, etc.) and then filling the lined trench with a conductor.

Item 210 represents a transistor (such as a field effect transistor (FET)). Transistors are also well known structures that are formed according to methods well known by those ordinarily skilled in the art (e.g., see U.S. Pat. No. 7,510,916, the complete disclosure of which is incorporated herein by reference) and a detailed discussion of transistor formation is not included herein. Transistors can be formed generally by doping a channel region within the substrate, forming a gate oxide above the channel region, forming a gate conductor above the channel region, and forming source and drain regions within the substrate on opposite sides of the gate conductor.

Item 212 represents a silicide block which is utilized to prevent silicide formation in areas of the substrate 200. Silicide blocks are also well known structures that are formed according to methods well known by those ordinarily skilled in the art and a detailed discussion of the formation process for silicide blocks is not included herein. Generally, silicide blocks can be formed by patterning (again using masks and other similar structures) material such as nitrides, oxides, etc. on the surface in lieu of the substrate 200.

Once such an intermediate structure is created, it may be desirable to complete the through silicon via structure 234 by removing the polysilicon placeholder 220 and forming a conductor that extends from the through silicon via 234. One manner in which this could be accomplished is by etching the placeholder material 220 through a photoresist mask formed on top of an insulator or dielectric layer 240.

One such photoresist mask is shown as item 222 in FIG. 2. The mask 222 includes an alignment opening (or process control mark) 204 that is positioned above (with respect to the top of the substrate 200) the kerf region 214 and an opening 206 that is positioned above the first opening 234. The process control mark 204 is necessary to properly align the opening 206 above the opening 234.

Figure 3:
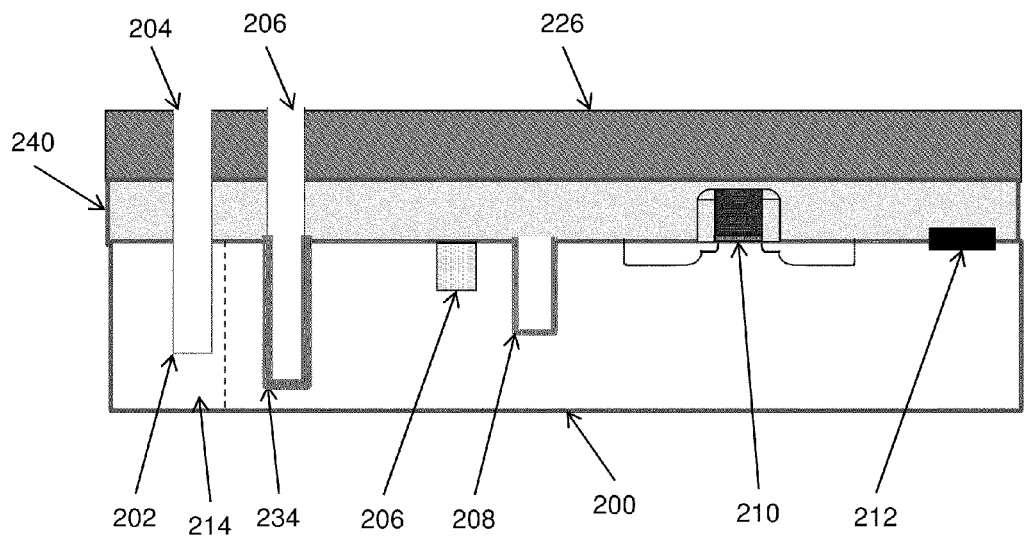
FIG. 3 is a schematic cross-sectional diagram of an integrated circuit structure according to embodiments herein.

FIG. 3 illustrates the structure after the material removal process (e.g., reactive ion etching) has removed the placeholder 220 from the opening 234. This removal process also etched an opening 202 into the substrate. This opening 202 is formed below the process control mark 204 can cause some undesirable problems including unintended substrate breakage, electrical shorts, etc. In addition, if the opening 202 is formed outside the kerf region 214, the opening 202 can interfere with (and potentially destroy) the various other structures shown in FIG. 2. Such openings 202 below process control marks are especially problematic as the aspect ratio of evolving integrated circuit devices makes substrate trenches longer and more narrow.

Figure 4:
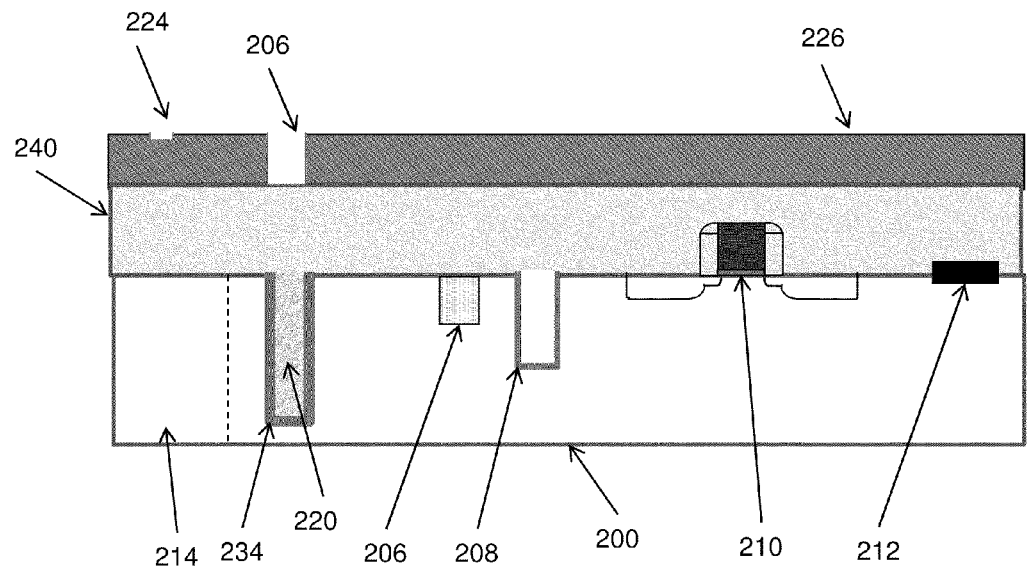
FIG. 4 is a schematic cross-sectional diagram of an integrated circuit structure according to embodiments herein.
Figure 5:
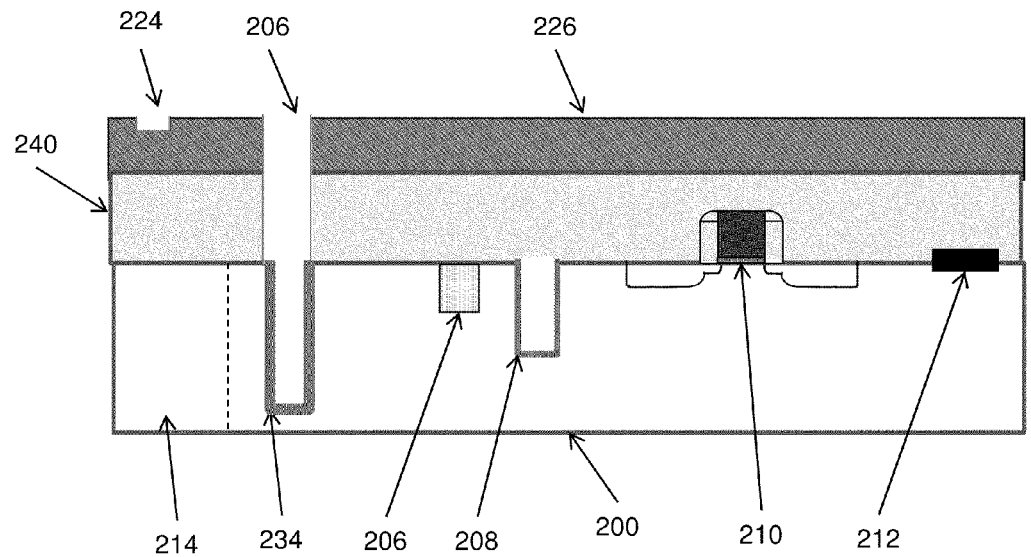
FIG. 5 is a schematic cross-sectional diagram of an integrated circuit structure according to embodiments herein.

The structure shown in FIG. 4 is similar to that shown in FIGS. 2 and 3; however a different etching mask 226 is utilized that includes a different type of process control mark opening 224. More specifically, the process control mark 224 is sub-lithographic and does not penetrate completely through the mask 226. Instead, mark 224 only penetrates, for example, 25%, 50%, 75% etc. through the mask 226 and the opening 224 does not run completely from the top of the mask 226 to the bottom of the mask 226. Therefore, as shown in FIG. 5, when the material removal process is performed to remove the placeholder 220, no opening is formed in the substrate 200 or dielectric 240 below the process control mark 224 and, possibly only some of the dielectric 240 is removed. Contrast this with the opening 202 that is formed in the substrate in FIG. 3. Therefore, by utilizing an etching mask that includes sub-lithographic process control marks that do not completely pass through the mask, the problems associated with openings formed below process control marks that are described above can be reduced or eliminated As an alternative to making the process control mark 224 less deep than the non-sub-lithographic process control mark 204 shown in FIGS. 2 and 3, the mask material 226 can be made thicker than the mask material 222. For example, the mask material of the mask 226 can be made 125%, 150%, 175%, 2×, 3×, 4×, thicker than the mask material 222. This potentially allows the process control mark formation process to remain the same and yet still allows the process control marks to not fully penetrate the mask material. Therefore, by either forming the process control mark in a more shallow manner and/or by making the mask material thicker, it is possible to prevent the process control marks from fully penetrating through the entire width of the etching mask material.

Figure 6:
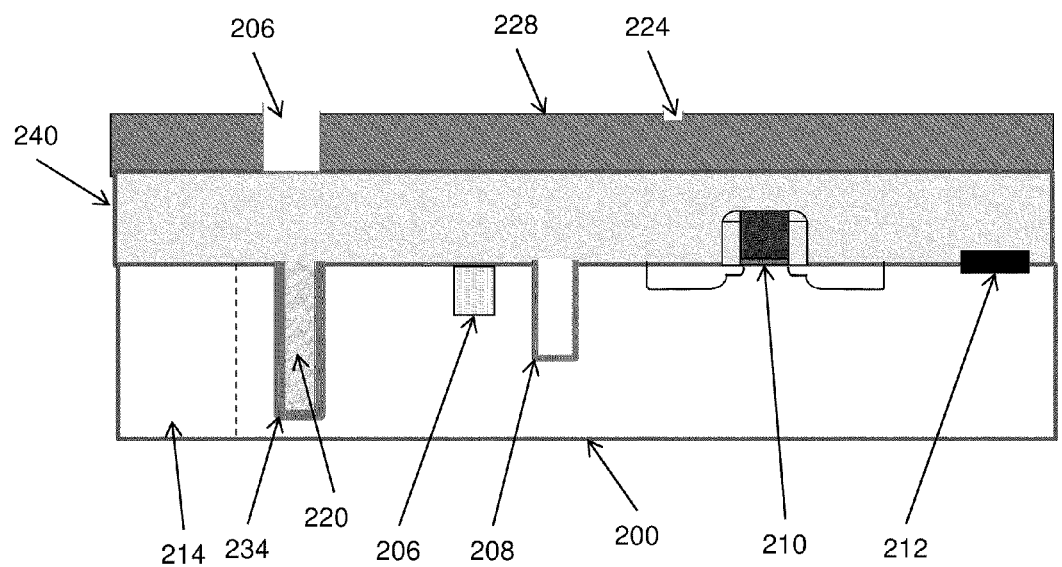
FIG. 6 is a schematic cross-sectional diagram of an integrated circuit structure according to embodiments herein.

Further, because the process control mark is not formed fully through the etching mask, the process control mark does not need to be placed above the kerf region 214. Therefore, as shown in FIG. 6, it is possible to create a mask 228 that includes a process control mark 224 that is not positioned above the kerf region 214 without causing substantial problems associated with the trench 202, mentioned above.

Figure 7:
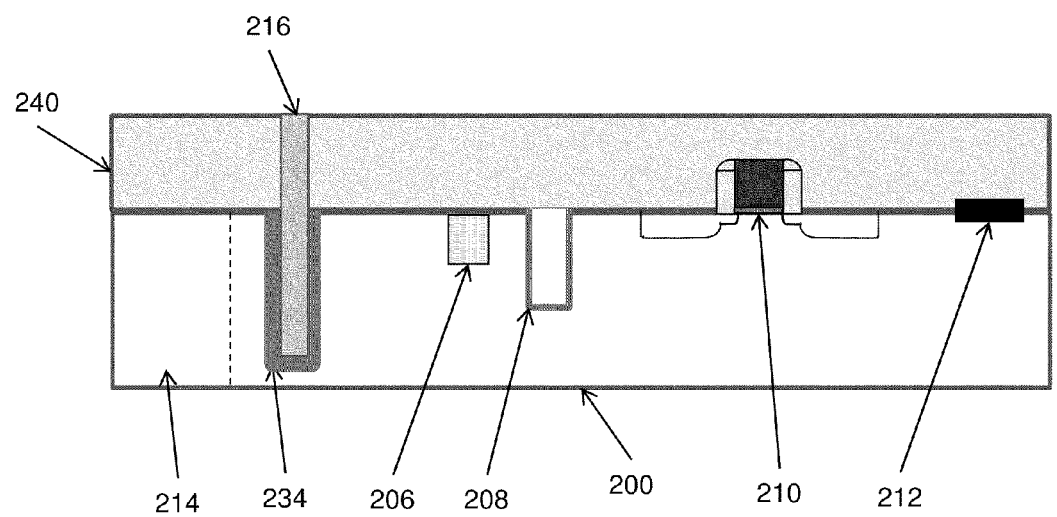
FIG. 7 is a schematic cross-sectional diagram of an integrated circuit structure according to embodiments herein.

All of the embodiments herein can form a conductor within the opening 234 to complete the through silicon via structure. Therefore, as shown in FIG. 7, a conductor 216 (tungsten, copper, polysilicon, etc.) can be formed in openings 234, 206 (see FIGS. 3 and 5) and then the etching mask can be removed in a selective material removal process that leaves the conductor 216 within the opening 234 and extending above the substrate 200 into the dielectric 240.

Figure 8:
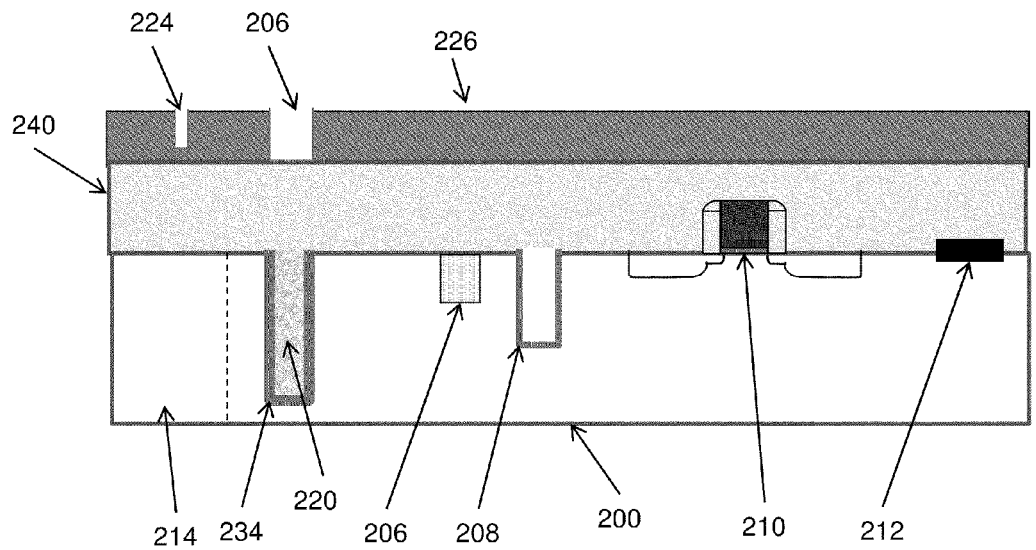
FIG. 8 is a schematic cross-sectional diagram of an integrated circuit structure according to embodiments herein.
Figure 9:
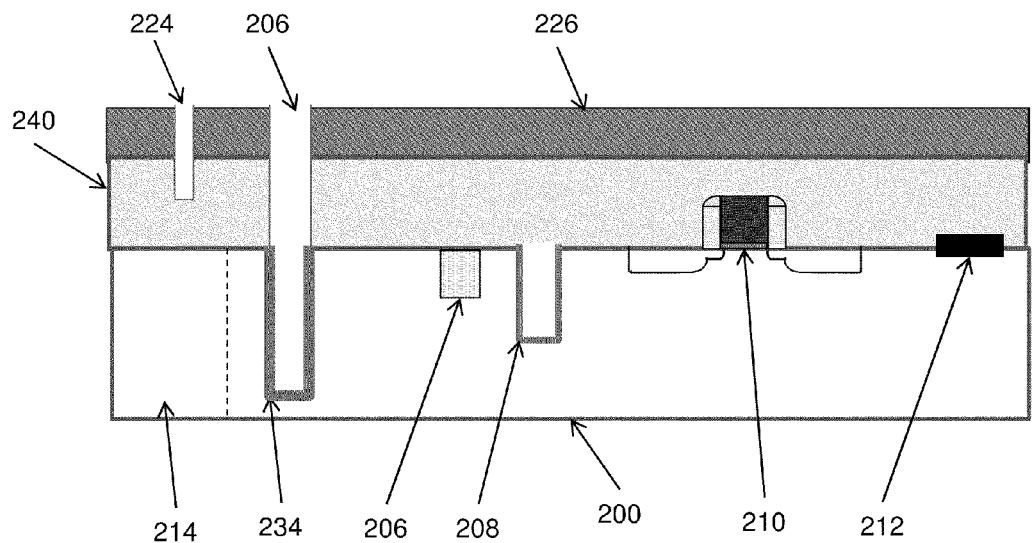
FIG. 9 is a schematic cross-sectional diagram of an integrated circuit structure according to embodiments herein.

Another embodiment involves designing process control marks that are not sub-lithographic, but that are much smaller than the device structures to be etched using the photomask. An example is shown in FIGS. 8 and 9. The process control mark 224 will be patterned through the photomask 226 and etched in the substrate 200, but to a shallower depth than the other features created by the photomask. Shallower structures are less likely to cause wafer breakage and other problems associated with deeply etched structures in the substrate. This embodiment is useful if the lithographic mark is needed at another level. Marks for measuring how accurately a photomask overlays previous mask structures are an example of such marks.

Figure 10:
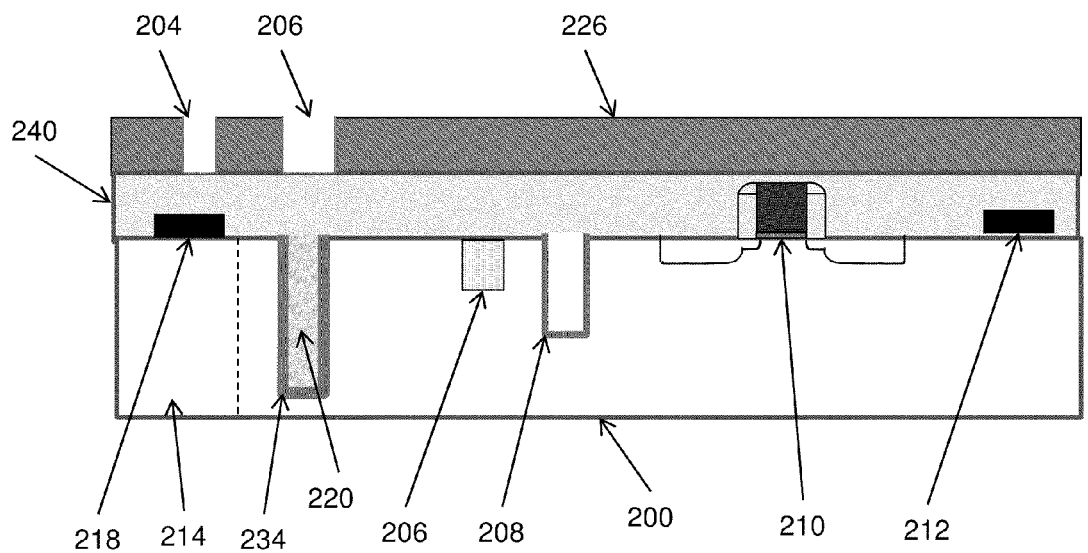
FIG. 10 is a schematic cross-sectional diagram of an integrated circuit structure according to embodiments herein.
Figure 11:
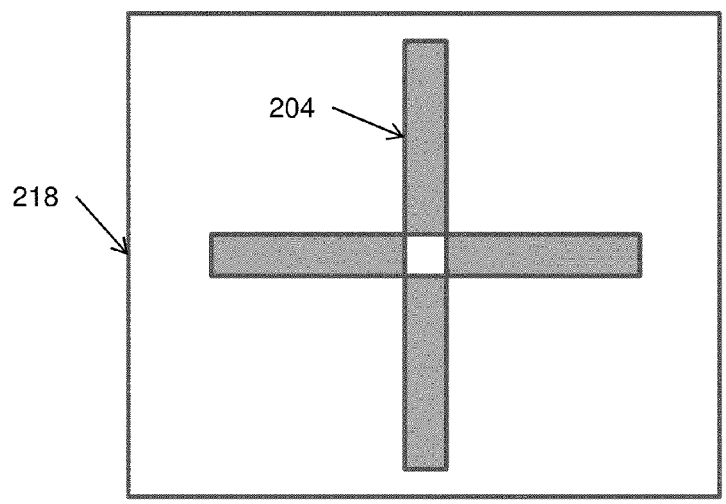
FIG. 11 is a schematic top-view diagram of a process control mark according to embodiments herein.
Figure 12:
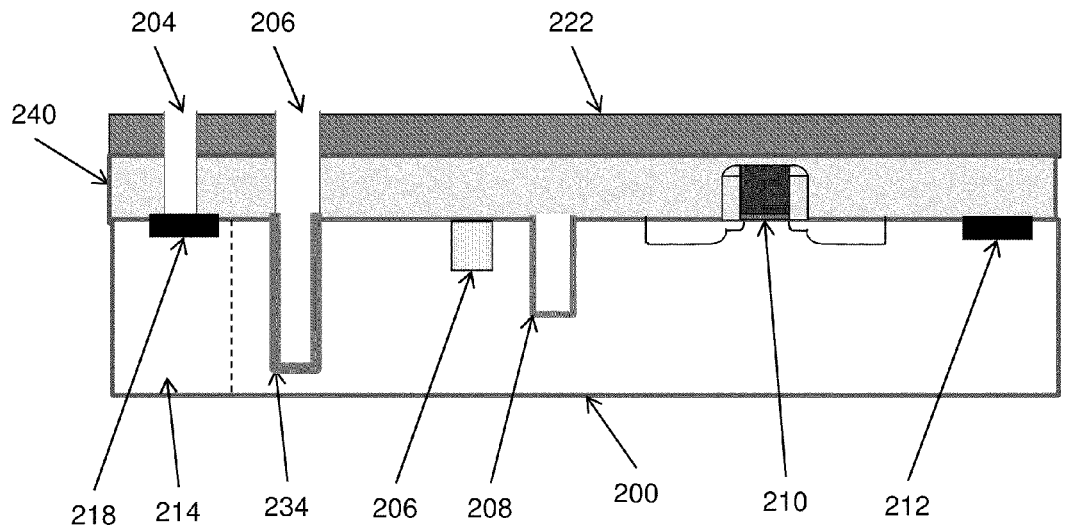
FIG. 12 is a schematic cross-sectional diagram of an integrated circuit structure according to embodiments herein.

Other embodiments herein can utilize the mask 222 (discussed above) that includes a process control mark opening 234 that extends fully through the mask 222 without damaging the underlying substrate by utilizing protective structures 218 that are positioned below the opening 204, as shown in FIG. 10. FIG. 11 illustrates the top-view of the process control mark 204 as it is positioned over the protective structure 218. As shown in FIG. 12, after the material removal process has removed the polysilicon 220, no trench 202 is formed within the substrate 200 because the protective structure 218 prevented the formation of any such trench.

Figure 13:
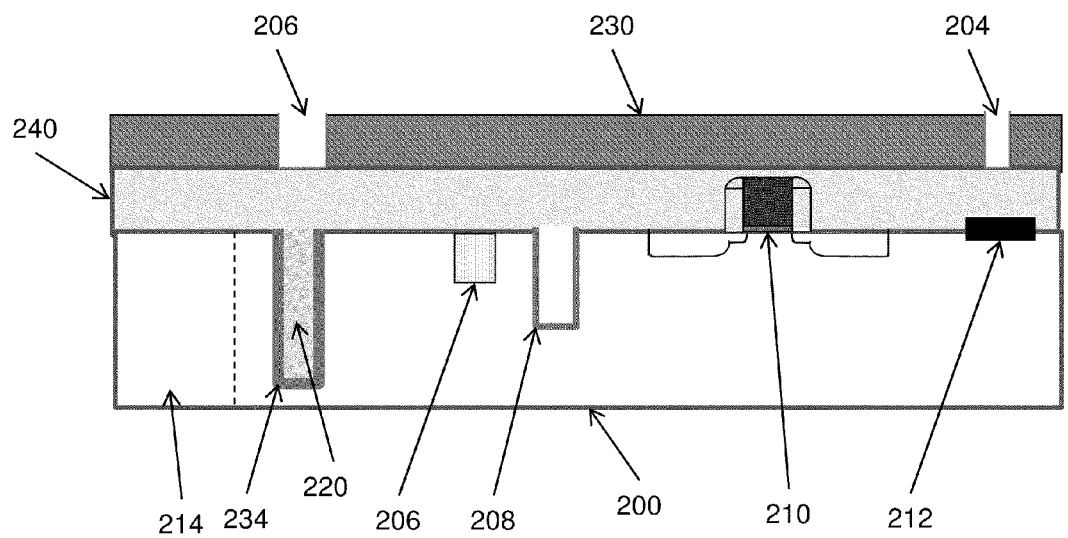
FIG. 13 is a schematic cross-sectional diagram of an integrated circuit structure according to embodiments herein.

FIG. 13 illustrates that utilization of protective pads can allow alignment marks 204 to be placed outside of the kerf area without substantial problems associated with trench 202, as described above.

The protective structures 218 can comprise any material that will not be attacked by the process that removes the polysilicon 220. For example, if a reactive ion etching process that attacks silicon is utilized to remove the polysilicon 220, the protective structure can be formed of an oxide, a nitride, etc. The protective structures can be formed using the same processes used to form the silicide breaks 212, discussed above.

In addition, if desired, other structures that will not be affected by the material removal process can be used as protective structures. For example, as shown in FIGS. 12 and 13, the silicide break 212 is utilized as the protective structure.

Figure 14:
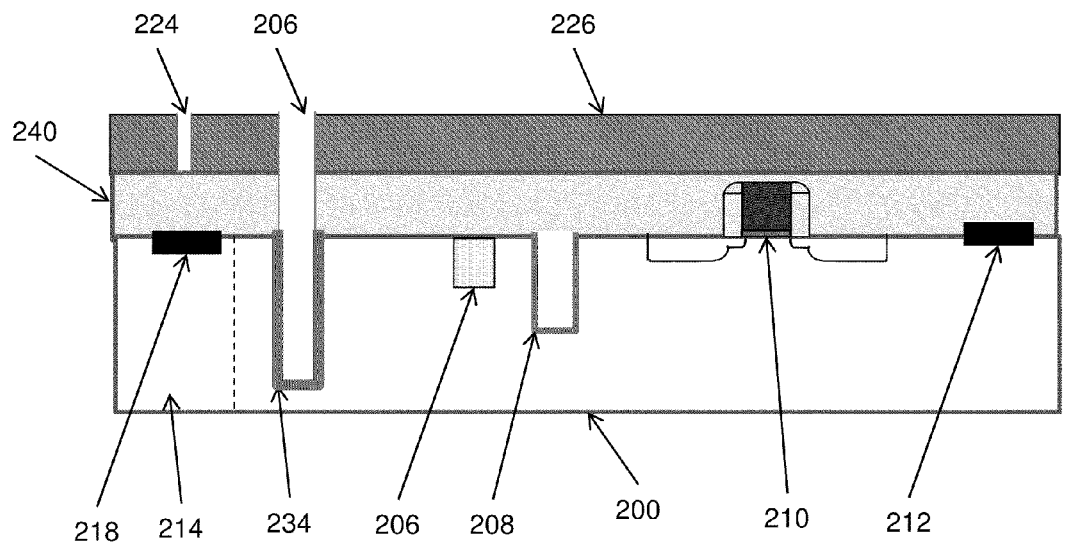
FIG. 14 is a schematic cross-sectional diagram of an integrated circuit structure according to embodiments herein.
Figure 15:
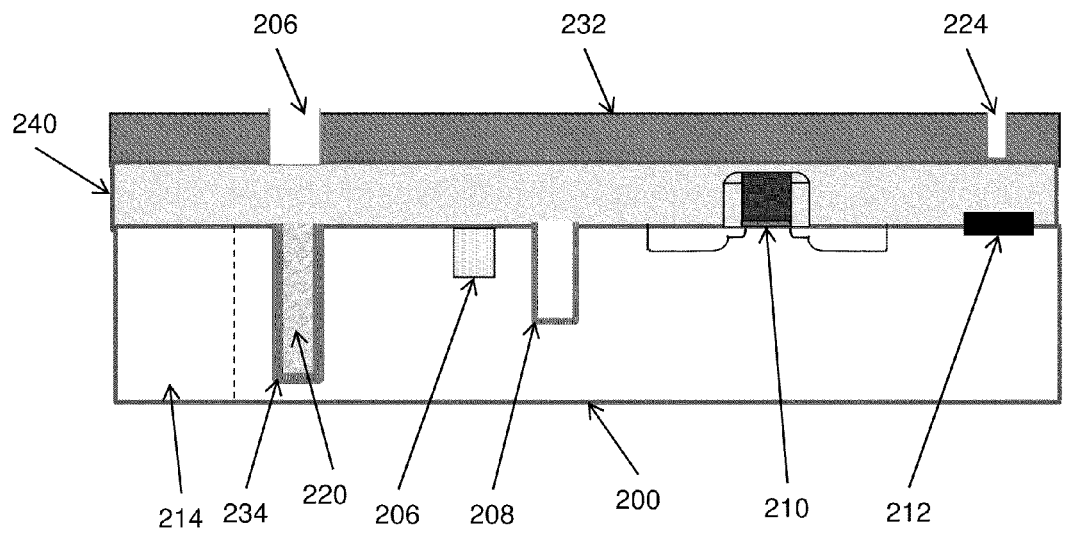
FIG. 15 is a schematic cross-sectional diagram of an integrated circuit structure according to embodiments herein.

The foregoing concepts can be combined. The protective structure 218 can be positioned below a process control mark 224 that does not extend fully through the etching mask material 226 as shown in FIG. 14. FIG. 15 illustrates that this same structure can be formed outside the kerf region 214 when the silicide break 212 is utilized as a protective structure below the process control mark 224 that does not fully extend through the etching mask material 226.

As mentioned above the various process control marks utilized can create extra shapes and if these extra shapes intersect an N-well-P-well boundary, or if they are inside the wrong well, then the extra shapes may cause a high resistance or short path which will degrade yield or reliability. These extra shapes can also exacerbate wafer breakage issues due to alignment of the TSV with the crystal plane of the substrate. Therefore, embodiments herein use shapes for mask alignment and mask inspection which are sub-lithographic, and which do not extend fully through the mask, so that shapes will not print on the substrate. In such embodiments, the process control mark is sub-lithographic and does not extend completely through the organic photoresist mask but instead only extends partially through the mask. Thus, the organic photoresist mask protects portions of the silicon substrate that are not beneath the second opening.

Figure 16:
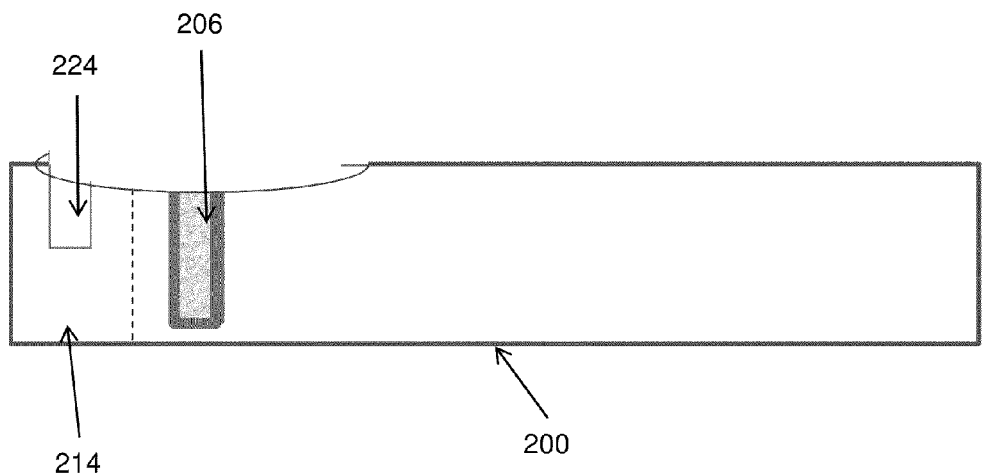
FIG. 16 is a schematic cross-sectional diagram of an integrated circuit structure according to embodiments herein.
Figure 17:
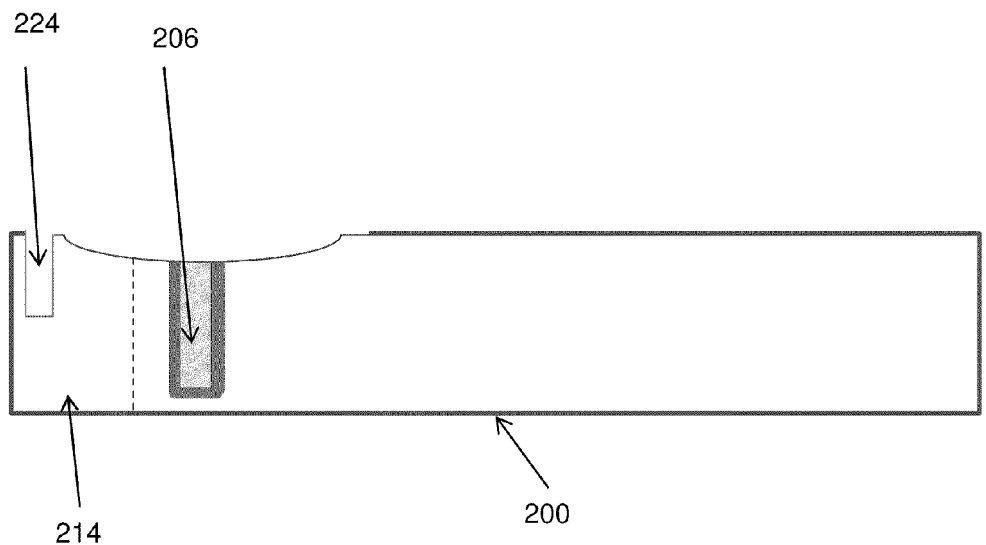
FIG. 17 is a schematic cross-sectional diagram of an integrated circuit structure according to embodiments herein.
Figure 18:
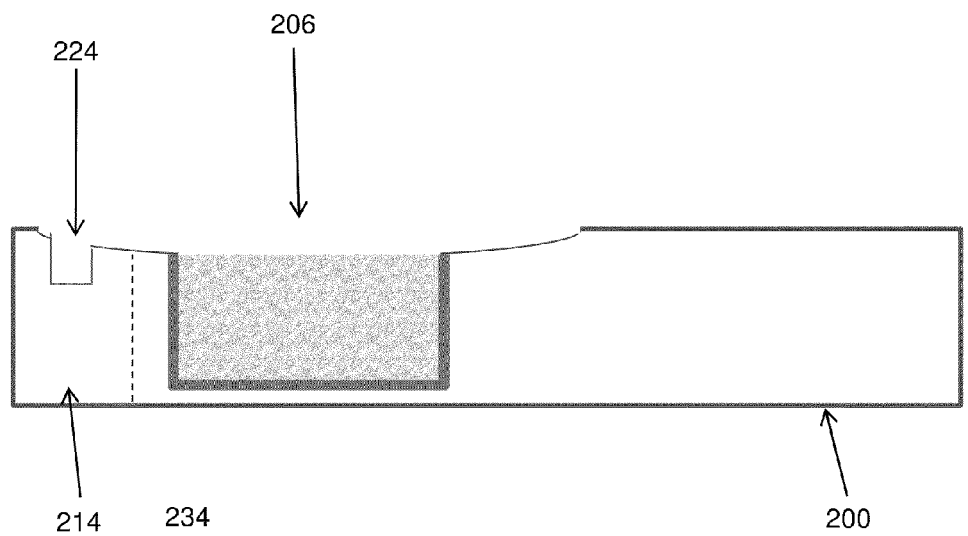
FIG. 18 is a schematic cross-sectional diagram of an integrated circuit structure according to embodiments herein.
Figure 19:
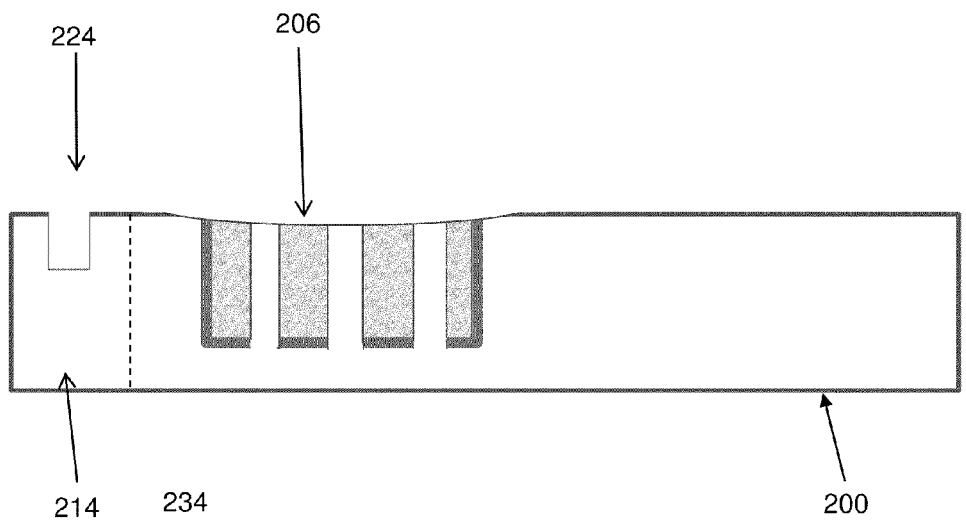
FIG. 19 is a schematic cross-sectional diagram of an integrated circuit structure according to embodiments herein.

In another embodiment, placement of lithographic structures in the kerf is designed so as to prevent damage to these structures from dishing caused by chemical-mechanical polish of nearby wide or deep structures. Some lithographic marks (e.g., overlay marks) need to be used after the level at which they are etched in the substrate or other film. As shown in FIG. 16, preferential polishing of a material in a large structure, such as material 220 in trench 206 can create dishing, which can damage nearby lithographic marks and render them unusable. Designing the lithographic mark layout to leave sufficient distance between large features and lithographic marks, as shown in FIG. 17, prevents this problem. Adding dummy-shape fill patterns or blocking patterns near critical structures reduces the width of openings or eliminates them. This can also prevents dishing of critical structures. The dishing created by opening 206 in FIG. 18 damages mark 224. Blocking all or a portion of the etch for opening 206 protects mark 224, as shown in FIG. 19.

The resulting integrated circuit chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

What is claimed is:

1. A method of manufacturing an integrated circuit structure, said method comprising:
    forming a first opening in a substrate, said opening having a specified length, width, and depth;
    filling said first opening with at least one fill material;
    patterning a protective material over said substrate, said protective material including a process control mark and including a second opening above, and aligned with, said first opening; and
    removing said fill material from said first opening through said second opening in said protective material,
    said process control mark comprising a recess within said protective material that extends only partially through said protective material, such that portions of said substrate below said process control mark are not affected by said removing of said fill material.

2. The method according to claim 1, wherein said process control mark does not extend completely through said protective material.

3. The method according to claim 1, said protective material protects portions of said substrate that are not beneath said second opening.

4. The method according to claim 1, said removing of said fill material comprising a process that would damage said substrate, and said protective material protects said substrate from said removing of said fill material.

5. The method according to claim 1, said process control mark being formed above a kerf region of said substrate.

6. A method of manufacturing an integrated circuit structure, said method comprising:
    forming a first opening in a silicon substrate;
    depositing a polysilicon material into said first opening;

patterning an organic photoresist over said silicon substrate, said organic photoresist including a process control mark and including a second opening above, and aligned with, said first opening; and performing reactive ion etching to remove said polysilicon material from said first opening through said second opening in said organic photoresist, said process control mark comprising a recess within said organic photoresist that extends only partially through said organic photoresist, such that portions of said silicon substrate below said process control mark are not affected by said reactive ion etching.

7. The method according to claim 6, wherein said process control mark does not extend completely through said organic photoresist.

8. The method according to claim 6, said organic photoresist protects portions of said silicon substrate that are not beneath said second opening.

9. The method according to claim 6, said reactive ion etching comprising a process that would damage said silicon substrate, and said organic photoresist and said oxide liner protect said silicon substrate from said removing of said fill material.

10. The method according to claim 6, said process control mark being formed above a kerf region of said silicon substrate.

\* \* \* \* \*